(12) United States Patent
Huang et al.

(10) Patent No.: US 10,283,479 B2
(45) Date of Patent: May 7, 2019

(54) PACKAGE STRUCTURES AND METHODS OF FORMING THE SAME

(71) Applicant: Taiwan Semiconductor Manufacturing Co., Ltd., Hsinchu (TW)

(72) Inventors: Li-Hsien Huang, Hsinchu County (TW); An-Jhih Su, Taoyuan (TW); Hsien-Wei Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/159,810

(22) Filed: May 20, 2016

(65) Prior Publication Data

US 2017/0338200 A1 Nov. 23, 2017

(51) Int. Cl.
| | |
|---|---|
| *H01L 23/00* | (2006.01) |
| *H01L 23/31* | (2006.01) |
| *H01L 21/56* | (2006.01) |
| *H01L 21/683* | (2006.01) |
| *H01L 23/498* | (2006.01) |

(52) U.S. Cl.
CPC .............. *H01L 24/73* (2013.01); *H01L 21/56* (2013.01); *H01L 21/6835* (2013.01); *H01L 23/3128* (2013.01); *H01L 23/49822* (2013.01); *H01L 24/19* (2013.01); *H01L 24/20* (2013.01); *H01L 24/32* (2013.01); *H01L 24/83* (2013.01); *H01L 21/568* (2013.01); *H01L 2224/04105* (2013.01); *H01L 2224/12105* (2013.01); *H01L 2224/32225* (2013.01); *H01L 2224/73267* (2013.01); *H01L 2924/14* (2013.01); *H01L 2924/1431* (2013.01); *H01L 2924/1436* (2013.01); *H01L 2924/1437* (2013.01); *H01L 2924/1443* (2013.01); *H01L 2924/18162* (2013.01); *H01L 2924/3511* (2013.01)

(58) Field of Classification Search
None
See application file for complete search history.

(56) References Cited

U.S. PATENT DOCUMENTS

| | | | | |
|---|---|---|---|---|
| 7,429,793 B2* | 9/2008 | Yamagata | ........... | H01L 23/5389 257/678 |
| 7,459,776 B1* | 12/2008 | St. Amand | .......... | H01L 25/0657 257/685 |
| 7,619,317 B2* | 11/2009 | Lien | ....................... | H01L 21/568 257/787 |
| 7,829,382 B2* | 11/2010 | Karnezos | ................ | H01L 25/03 257/686 |

(Continued)

*Primary Examiner* — Andres Munoz
(74) *Attorney, Agent, or Firm* — JCIPRNET

(57) ABSTRACT

Package structures and methods of forming the same are disclosed. A package structure includes at least one first integrated circuit, at least one second integrated circuit, at least one dummy substrate and an encapsulant. The at least one second integrated circuit is disposed on the at least one dummy substrate in a first direction, and the at least one first integrated circuit and the at least one dummy substrate are separated by a distance in a second direction perpendicular to the first direction. The encapsulant is aside the at least one first integrated circuit, the at least one second integrated circuit and the at least one dummy substrate.

20 Claims, 13 Drawing Sheets

(56) References Cited

U.S. PATENT DOCUMENTS

| | | | | |
|---|---|---|---|---|
| 7,977,802 B2* | 7/2011 | Pagaila | .................... | H01L 24/32 |
| | | | | 257/686 |
| 8,164,171 B2* | 4/2012 | Lin | .................... | H01L 23/49816 |
| | | | | 257/685 |
| 8,193,604 B2* | 6/2012 | Lin | .................... | H01L 23/49816 |
| | | | | 257/379 |
| 8,474,133 B2* | 7/2013 | Eichelberger | ....... | H01L 21/6835 |
| | | | | 29/832 |
| 8,896,109 B2* | 11/2014 | Pagaila | .................... | H01L 25/16 |
| | | | | 257/678 |
| 9,865,566 B1* | 1/2018 | Yu | ........................ | H01L 25/0655 |
| 2010/0035384 A1* | 2/2010 | Eichelberger | ....... | H01L 21/6835 |
| | | | | 438/121 |
| 2010/0289131 A1* | 11/2010 | Bathan | .................... | H01L 24/17 |
| | | | | 257/686 |
| 2011/0037157 A1* | 2/2011 | Shin | .................... | H01L 23/49833 |
| | | | | 257/686 |
| 2013/0119552 A1* | 5/2013 | Lin | .................... | H01L 25/0652 |
| | | | | 257/774 |
| 2014/0203429 A1* | 7/2014 | Yu | .......................... | H01L 21/78 |
| | | | | 257/737 |
| 2014/0264836 A1* | 9/2014 | Chun | .................... | H01L 23/16 |
| | | | | 257/737 |
| 2015/0115458 A1* | 4/2015 | Palm | .................... | H01L 24/31 |
| | | | | 257/774 |
| 2015/0380387 A1* | 12/2015 | Ben Jamaa | ............ | H01L 25/50 |
| | | | | 257/713 |

* cited by examiner

PACKAGE STRUCTURES AND METHODS OF FORMING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
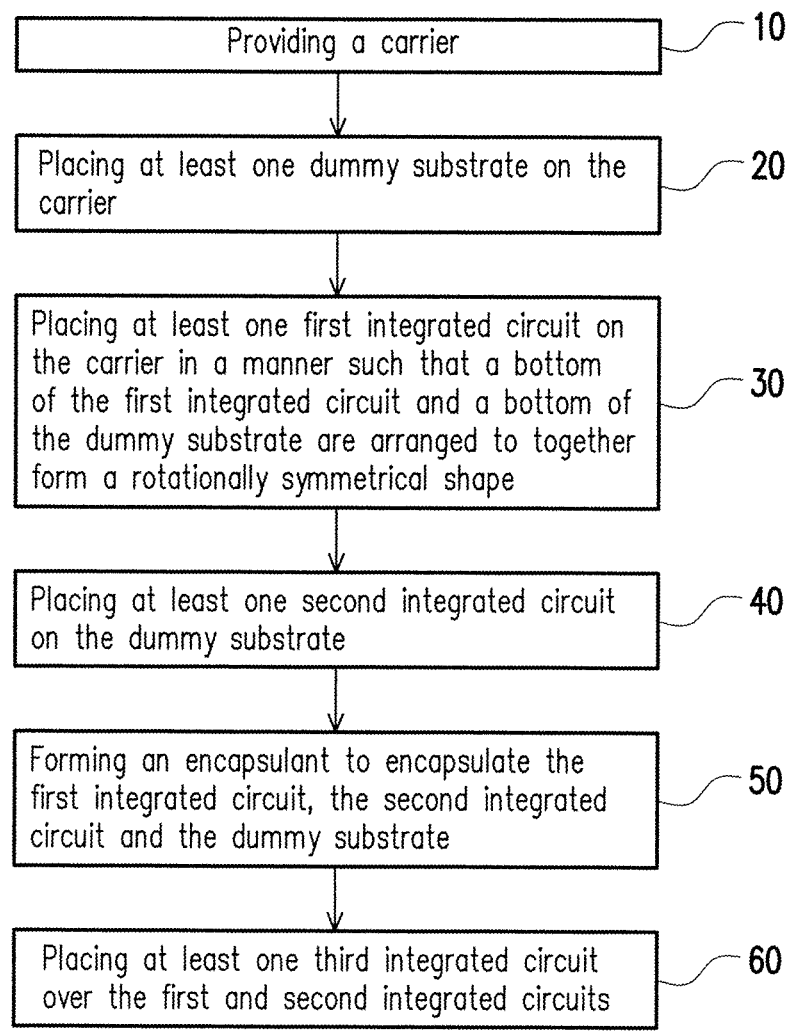
FIG. 1 illustrates a flow chart of a method of forming a package structure in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

FIG. 1 illustrates a flow chart of a method of forming a package structure in accordance with some embodiments. FIG. 2A to FIG. 2I illustrate cross-sectional views of a method of forming a package structure in accordance with some embodiments.

Figure 2A:
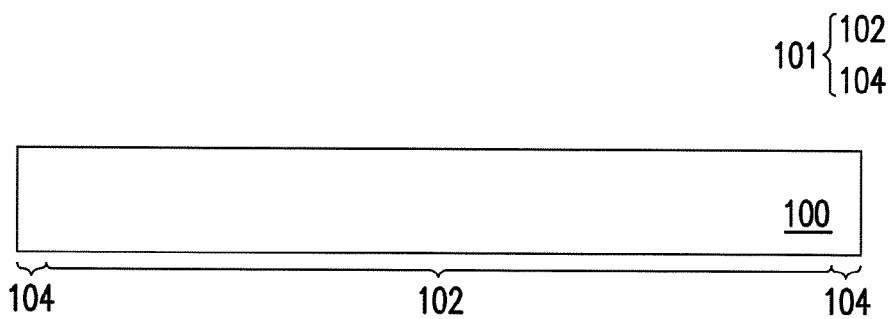
FIG. 2A to FIG. 2I illustrate cross-sectional views of a method of forming a package structure in accordance with some embodiments.

Referring to FIG. 1 and FIG. 2A, at step 10, a carrier 100 is provided.

In some embodiments, the carrier 100 has a package area 101 including an integrated circuit area 102 and a periphery area 104 aside the integrated circuit area 102. In some embodiments, the periphery area 104 surrounds the integrated circuit area 102. In some embodiments, the carrier 100 may have a glue layer (not shown) thereon for de-bond usage. In some embodiments, the carrier 100 may be a glass carrier, and the glue layer may be a Ultra-Violet (UV) glue layer or a Light-to-Heat Conversion (LTHC) glue layer. In some embodiments, the glue layer is even protected by forming a polymer layer thereon. The polymer material may be a photo-sensitive material such as polybenzoxazole (PBO), polyimide, benzocyclobutene (BCB), a combination thereof and/or the like.

Figure 2B:
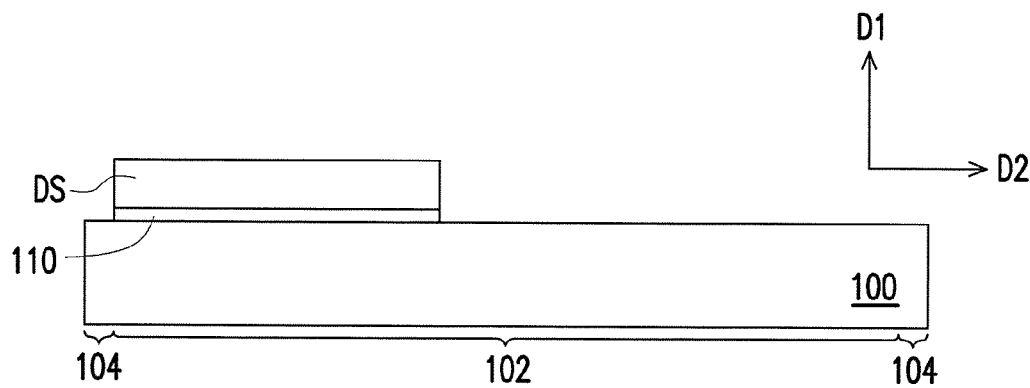

Referring to FIG. 1 and FIG. 2B, at step 20, at least one dummy substrate DS is placed on the carrier 100.

In some embodiments, the dummy substrate DS includes a group IV element or a group III-V semiconductor compound, such as Si, Ge, SiGe, GaAs, InAs, InGaAs, or the like. In some embodiments, the dummy substrate DS includes silicon substrate or a substrate formed of other suitable semiconductor materials. In some embodiments, the dummy substrate DS is provided with a glue layer 110. In some embodiments, the glue layer 110 is formed of an adhesive such as a die attach film (DAF), epoxy, silver paste, or the like, although other types of adhesives may be used.

Figure 2C:
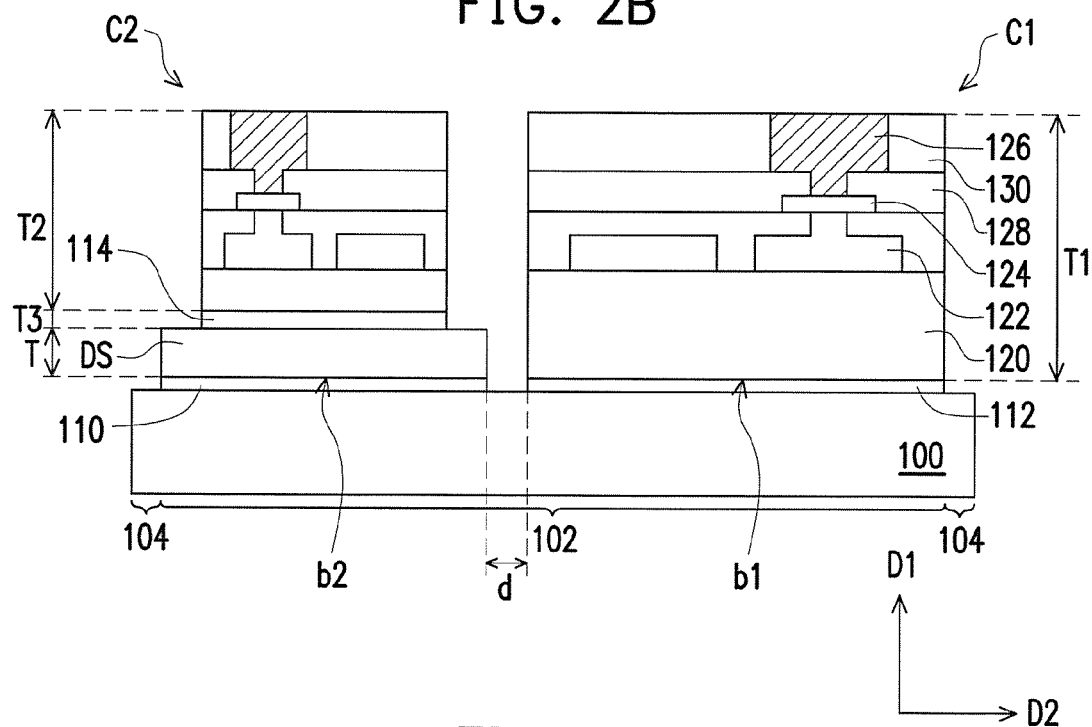
Figure 3:
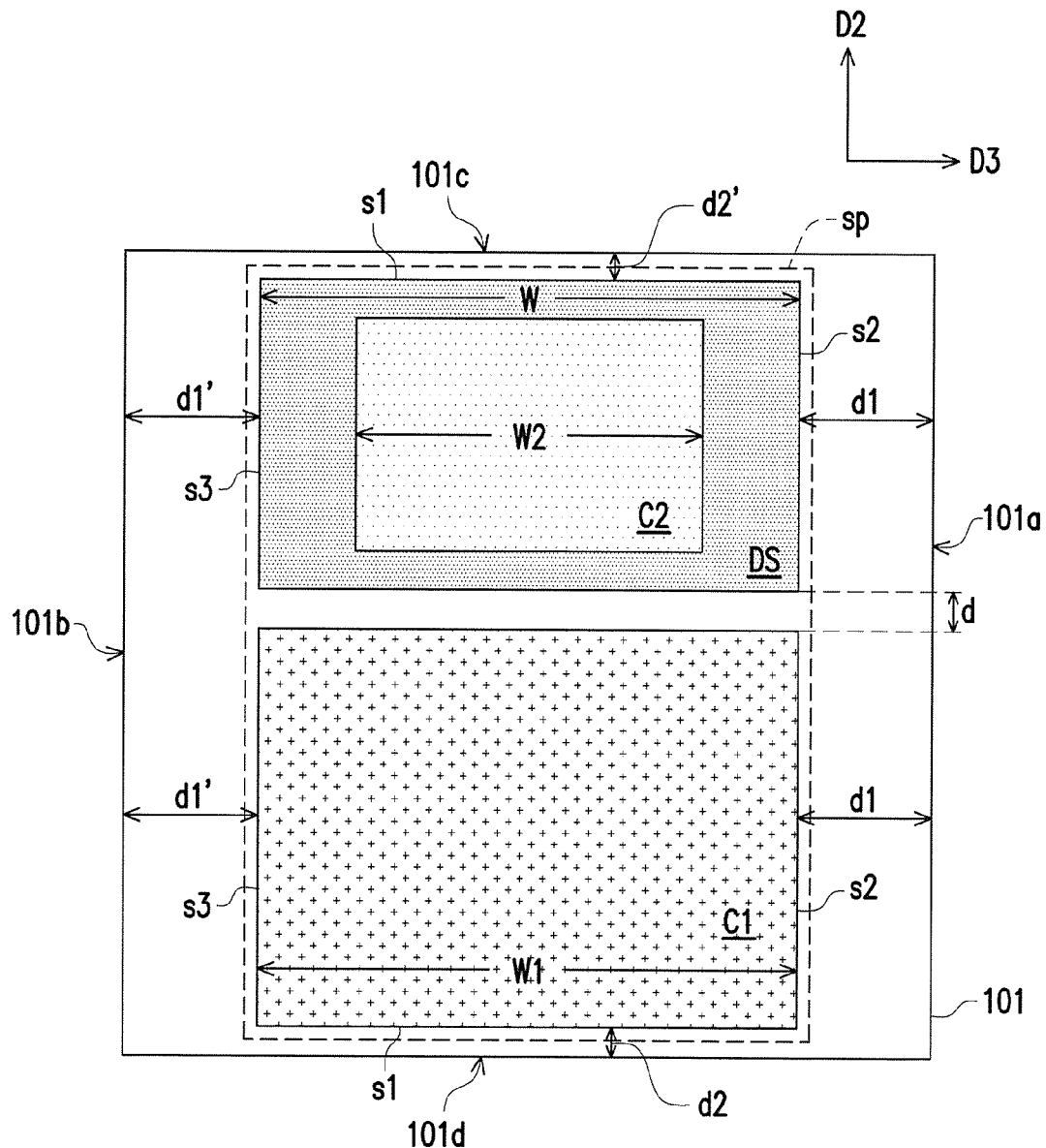
FIG. 3 illustrates a simplified view of a package structure in accordance with some embodiments.

Referring to FIG. 1 and FIG. 2C, at step 30, at least one first integrated circuit C1 is placed on the carrier 100 in a manner such that a bottom b1 of the first integrated circuit C1 and a bottom b2 of the dummy substrate DS are arranged to together form a rotationally symmetrical shape sp (shown in FIG. 3). In some embodiments, in a first direction D1, the first integrated circuit C1 is picked and placed on the carrier 100. In some embodiments, the first integrated circuit C1 is provided with a glue layer 112. In some embodiments, the first integrated circuit C1 and the dummy substrate DS are separated by a distance d in a second direction D2 perpendicular to the first direction D1. In some embodiments, the step of placing the first integrated circuit C1 is after the dummy substrate DS is placed on the carrier 100. In alternative embodiments, the step of placing the first integrated circuit C1 is before the dummy substrate DS is placed on the carrier 100.

Referring to FIG. 1 and FIG. 2C, at step 40, at least one second integrated circuit C2 is placed on the dummy substrate DS. In some embodiments, in the first direction D1, the second integrated circuit C2 is picked and placed on the dummy substrate DS. In some embodiments, the second integrated circuit C2 is provided with a glue layer 114. In some embodiments, the step of placing the second integrated circuit C2 is after the first integrated circuit C1 is placed on the carrier 100. In alternative embodiments, the step of placing the second integrated circuit C2 is before the first integrated circuit C1 is placed on the carrier 100.

In some embodiments, each of the first and second integrated circuits C1, C2 is, for example, a die, and includes an interconnection 122, a pad 124 and a connector 126. The interconnection 122 is formed over a substrate 120. In some embodiments, the glue layer 114 is disposed between the substrate 120 of the second integrated circuit C2 and the dummy substrate DS. The substrate 120 includes, for example but not limited to, bulk silicon, doped or undoped, or an active layer of a semiconductor-on-insulator (SOI) substrate. The pad 124 is formed over and electrically connected to the interconnection 122. In some embodiments, each of the first and second integrated circuits C1, C2 includes an active surface (not shown), the pad 124 is distributed on the active surface. The connector 126 is formed over and electrically connected to the pad 124. In some embodiments, the connector 126 is formed as the top portion of each of the first and second integrated circuits C1, C2. The connector 126 protrudes from the remaining portion or lower portion of each of the first and second integrated circuits C1, C2. The connector 126 can be electrical connectors, dummy connectors or both. The connector 126 include solder bumps, gold bumps, copper posts or the like. In some embodiments, the connector 126 is a copper bump. In some embodiments, the pad 124 is partially exposed by a passivation layer 128, and the connector 126 is encapsulated by a protection layer 130.

In some embodiments, a coefficient of thermal expansion (CTE) of the dummy substrate DS is similar to a CTE of the substrate 120 of at least one of the first integrated circuit C1 disposed adjacent thereto and the second integrated circuit C2 disposed thereon. In some embodiments, the CTE of the dummy substrate DS is, for example, substantially equal to the CTE of the substrate 120 of at least one of the first and second integrated circuits C1, C2. In some embodiments, a material of the dummy substrate DS may be the same with the substrate 120 of at least one of the first and second integrated circuits C1, C2. In alternative embodiments, a material of the dummy substrate DS may be different from the substrate 120 of at least one of the first and second integrated circuits C1, C2. In alternative embodiments, the dummy substrate DS may have a CTE similar to or substantially equal to an effective CTE of at least one of the first and second integrated circuits C1, C2.

In some embodiments, a thickness T1 of the first integrated circuit C1 is substantially equal to a total thickness of a thickness T of the dummy substrate DS, a thickness T2 of the second integrated circuit C2 disposed thereon and a thickness T3 of the glue layer 114, that is, T1=T2+T+T3. In some embodiments, before placing the first and second integrated circuits C1, C2, a grinding process is performed on at least one of the first and second integrated circuits C1, C2. In alternative embodiments, each of the first and second integrated circuits C1, C2 is a package having a die and an encapsulant aside the die and having a determined thickness.

FIG. 3 illustrates a simplified view of a package structure of FIG. 2C in accordance with some embodiments. Referring to FIG. 3, the bottom of the first integrated circuit C1 and the bottom of the dummy substrate DS are arranged to together form the rotationally symmetrical shape sp. It is note that the term "the rotationally symmetrical shape" means a shape substantially having rotational symmetry and a shape substantially composed of a shape of the bottom of the first integrated circuit C1, a shape of the bottom of the dummy substrate DS and a shape of a gap therebetween. In some embodiments, the rotationally symmetrical shape sp is substantially a rectangle. In alternative embodiments, the rotationally symmetrical shape sp may be a square or a regular polygon. In some embodiments, the package area 101 is substantially a rotationally symmetrical shape such as a rectangle. In some embodiments, a center of the rotationally symmetrical shape sp forming by the bottom of the first integrated circuit C1 and the bottom of the dummy substrate DS is overlapped with a center of the package area 101. Accordingly, distances between the rotationally symmetrical shape sp and opposite borders 101a-101d of the package area 101 are respectively the same. In detail, the package area 101 has borders 101a-101d, the border 101a is opposite to the border 101b, and the border 101c is opposite to the border 101d. In some embodiments, a distance d1 between the border 101a and the rotationally symmetrical shape sp is substantially equal to a distance d1' between the opposite border 101b and the rotationally symmetrical shape sp. In some embodiments, a distance d2' between the border 101c and the rotationally symmetrical shape sp is substantially equal to a distance d2 between the opposite border 101d and the rotationally symmetrical shape sp. In alternative embodiments, for better wafer and package warpage control, the distances d1, d1', d2, d2' between the borders 101a-101d and the rotationally symmetrical shape sp are the same, that is, d1=d1'=d2=d2'.

In some embodiments, in a third direction D3 perpendicular to the second direction D2, a width W1 of the first integrated circuit C1 is, for example, larger than a width W2 of the second integrated circuit C2. In some embodiments, in the third direction D3, a width W of the dummy substrate DS is, for example, substantially equal to the width W1 of the first integrated circuit C1.

In some embodiments, the first integrated circuit C1 includes a first side s1, a second side s2 adjacent to the first side s1, and a third side s3 opposite to the second side s2, wherein the first side s1 has the width W1. The dummy substrate DS includes a first side s1, a second side s2 adjacent to the first side s1, and a third side s3 opposite to the second side s2, wherein the first side s1 has the width W. In some embodiments, the first integrated circuit C1 and the dummy substrate DS are arranged together form the rotationally symmetrical shape sp by aligning the second side s2 of the first integrated circuit C1 and the second side s2 of the dummy substrate DS in the second direction D2 with the distance d therebetween. Accordingly, a distance d1 between the border 101a of the package area 101 and the second side s2 of the first integrated circuit C1 is substantially equal to a distance d1 between the border 101a of the package area 101 and the second side s2 of the dummy substrate DS. In some embodiments, the distance d1' between the border 101b of the package area 101 and the third side s3 of the first integrated circuit C1 is substantially equal to a distance d1' between the border 101b of the package area 101 and the third side s3 of the first integrated circuit C1. In some embodiments, the distance d1 is substantially equal to the distance d1'. In some embodiments, a distance d2 between the border 101d of the package area 101 and the first side s1 of the first integrated circuit C1 is substantially equal to a distance d2' between the border 101c of the package area 101 and the first side s1 of the dummy substrate DS.

Figure 2D:
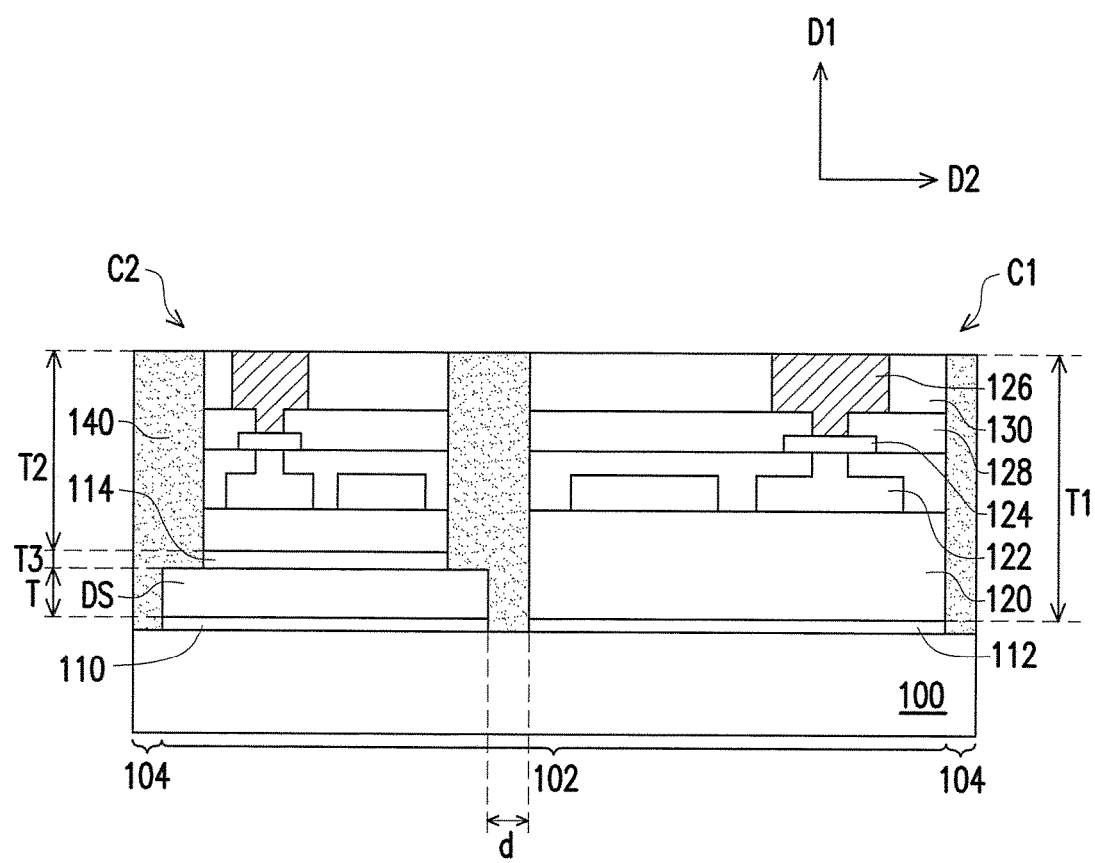

Referring to FIG. 1 and FIG. 2D, at step 50, an encapsulant 140 is formed in the integrated circuit area 102 and the periphery area 104 to encapsulate the first integrated circuit C1, the second integrated circuit C2 and the dummy substrate DS. A material of the encapsulant 140 may include molding compound materials including resin and filler, a photo-sensitive material such as polybenzoxazole (PBO), polyimide, benzocyclobutene (BCB), any combination thereof and/or the like. In alternative embodiments, the insulating material may be formed of a nitride such as silicon nitride, an oxide such as silicon oxide, phosphosilicate glass (PSG), borosilicate glass (BSG), boron-doped phosphosilicate glass (BPSG), any combination thereof and/or the like. In some embodiments, the CTE of the dummy substrate DS is significantly lower than a CTE of the encapsulant 140.

In some embodiments, a forming method of the encapsulant 140 includes the following steps. An insulating material is formed on the carrier 100 across the integrated circuit area 102 and the periphery area 104, to cover the first and second integrated circuits C1, C2 and the dummy substrate DS. In some embodiments, the insulating material is a molding compound formed by molding process. Then, the insulating material is grinded until the top surfaces of the connectors 126 and the top surfaces of the protection layers 130 are exposed. After the insulating material is grinded, an encapsulant 140 is formed. In some embodiments, the connectors 126 and the protection layers 130 of the first and second integrated circuits C1, C2 are not revealed and are well protected by the insulating material during the formation of the insulating material. As shown in FIG. 2D, it is noted that the top surface of the encapsulant 140, the top surfaces of the connectors 126, and the top surfaces of the protection layers 130 are substantially coplanar. In alternative embodiments, the protective layer 130 may cover the top surfaces of the connectors 126, and the portions of the protection layer 130 are grinded during the grinding process of the insulating material.

Figure 2E:
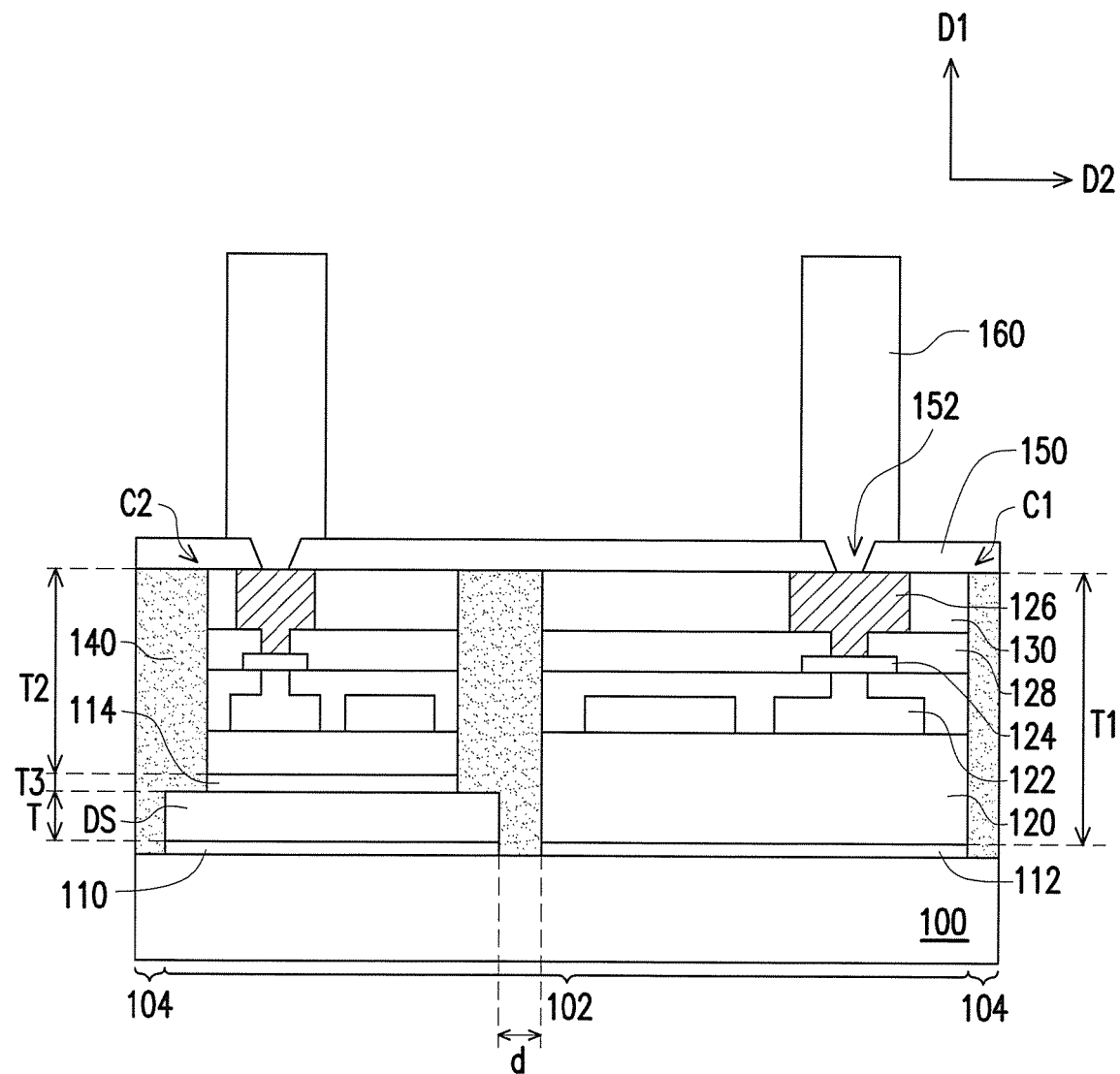

Referring to FIG. 2E, a dielectric layer 150 is formed on the top surfaces of the first and second integrated circuits C1, C2 and the top surface of the encapsulant 140. The dielectric layer 150 includes at least one contact opening 152. In some embodiments, a plurality of contact opening 152 for exposing the top surfaces of the connectors 126 are formed in the dielectric layer 150. It is noted that the number of the contact openings 152 is corresponding to the number of the connectors 126. In some embodiments, the dielectric layer 150 is a polybenzoxazole (PBO) layer, for example.

Then, a plurality of conductive through vias 160 is formed on the dielectric layer 150 to electrically connect to the connectors 126 through the contact openings 152. In some embodiments, the plurality of conductive through vias 160 is formed by photolithography, plating, and photoresist stripping process. For example, the conductive through vias 160 include copper posts.

Figure 2F:
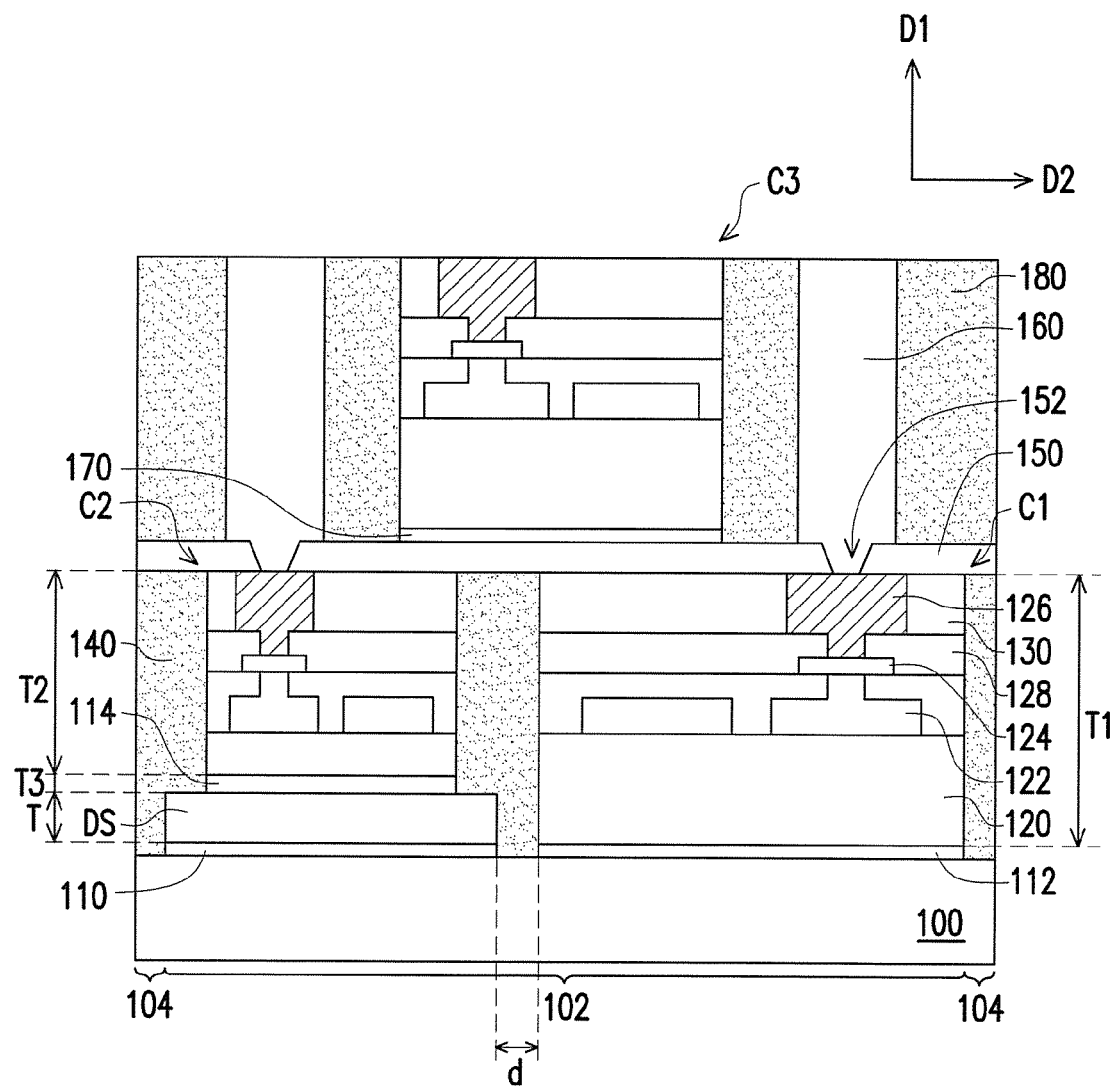

Referring to FIG. 1 and FIG. 2F, at step 60, at least one third integrated circuit C3 is placed over the first and second integrated circuits C1, C2. In some embodiments, the third integrated circuit C3 is picked and placed on the dielectric layer 150. In some embodiments, the third integrated circuit C3 is provided with a glue layer 170. Then, an encapsulant 180 is formed over the dielectric layer 150 to cover the third integrated circuit C3 and the conductive through vias 160. In some embodiments, the third integrated circuit C3 is a die having a structure similar to the first and second integrated circuits C1, C2. In alternative embodiments, the third integrated circuit C3 is a package having a die and an encapsulant aside the die. In some embodiments, the method of forming the encapsulant 180 is similar to the method of forming the encapsulant 140, so the details are not iterated herein. As shown in FIG. 2F, it is noted that the top surfaces of the conductive through vias 160, the top surface of the encapsulant 180, and the top surfaces of the connector 126 and the protection layer 130 of the third integrated circuit C3 are substantially coplanar.

As shown in FIG. 2E and FIG. 2F, the third integrated circuit C3 is picked and placed on the dielectric layer 150 after the formation of the conductive through vias 160. However, the disclosure is not limited thereto. In alternative embodiments, the third integrated circuit C3 is picked and placed on the dielectric layer 150 before the formation of the conductive through vias 160. In some embodiments, the first, second and third integrated circuits C1, C2, C3 may be memory chips, such as a DRAM, SRAM, NVRAM, or logic circuits. In this embodiment, the first and second integrated circuits C1, C2 are memory chips, and the third integrated circuit C3 is a logic circuit.

Figure 2G:
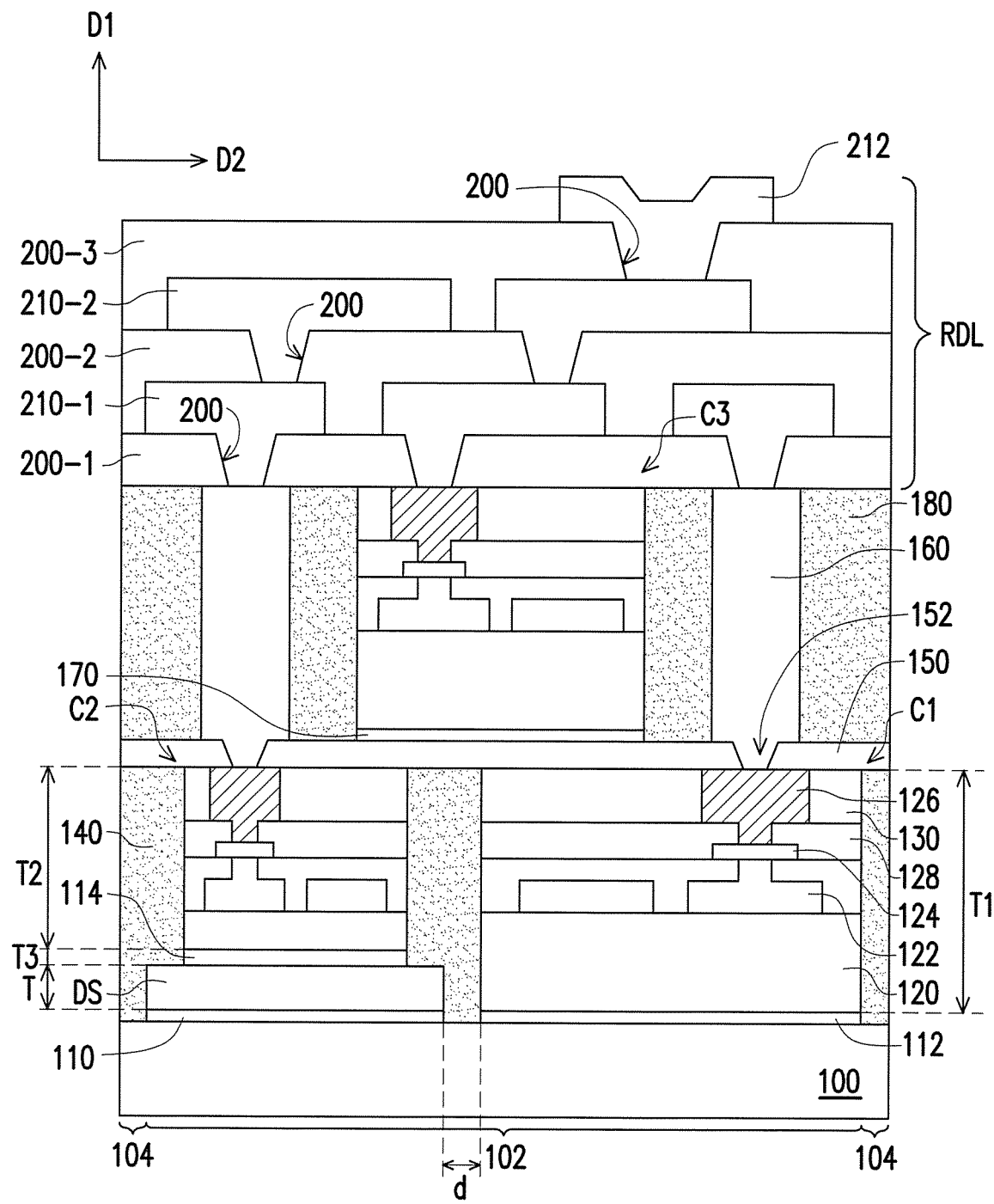

Referring to FIG. 2G, after the encapsulant 180 is formed, a redistribution circuit structure RDL electrically connected to the connector 126 of the third integrated circuit C3 is formed on the top surfaces of the conductive through vias 160, the top surface of the encapsulant 180, the top surface of the connectors 126, and the top surface of the protection layer 130. The redistribution circuit structure RDL is fabricated to electrically connect with at least one connector underneath. Here, the afore-said connector(s) may be the connector 126 of the third integrated circuit C3 and/or the conductive through vias 160 in the encapsulant 180. The fabrication of the redistribution circuit structure RDL includes the following steps. First, a dielectric layer 200-1 is formed on the encapsulant 180 and the protection layer 130, wherein openings 200 in the dielectric layer 200-1 expose the connector 126 and the conductive through vias 160. Then, patterned conductive layers 210-1 are formed in the openings 200 of the dielectric layer 200-1 to electrically connect to the connector 126 and the conductive through vias 160, respectively. In some embodiments, a dielectric layer 200-2 is formed on the dielectric layer 200-1, wherein openings 200 in the dielectric layer 200-2 expose the patterned conductive layers 210-1. Thereafter, patterned conductive layers 210-2 are formed in the openings 200 of the dielectric layer 200-2 to electrically connect to the patterned conductive layers 210-1. In some embodiments, a dielectric layer 200-3 is formed on the dielectric layer 200-2, and an opening 200 in the dielectric layer 200-3 exposes the patterned conductive layer 210-2. In other words, after the dielectric layer 200-1 and the patterned conductive layer 210-1 are formed, steps of forming the dielectric layer and the patterned conductive layers can be repeated at least one time so as to fabricate the redistribution circuit structure RDL over the third integrated circuit C3 and the encapsulant 180. The redistribution circuit structure RDL includes a plurality of dielectric layers and a plurality of patterned conductive layers stacked alternately.

As shown in FIG. 2G, in some embodiments, the topmost patterned conductive layer of the redistribution circuit structure RDL may include at least one under-ball metallurgy (UBM) pattern 212 for electrically connecting with conductive ball and/or at least one connection pad (not shown) for electrically connecting with at least one passive component. The number of the under-ball metallurgy pattern 212 and the connection pad is not limited in this disclosure.

Figure 2H:
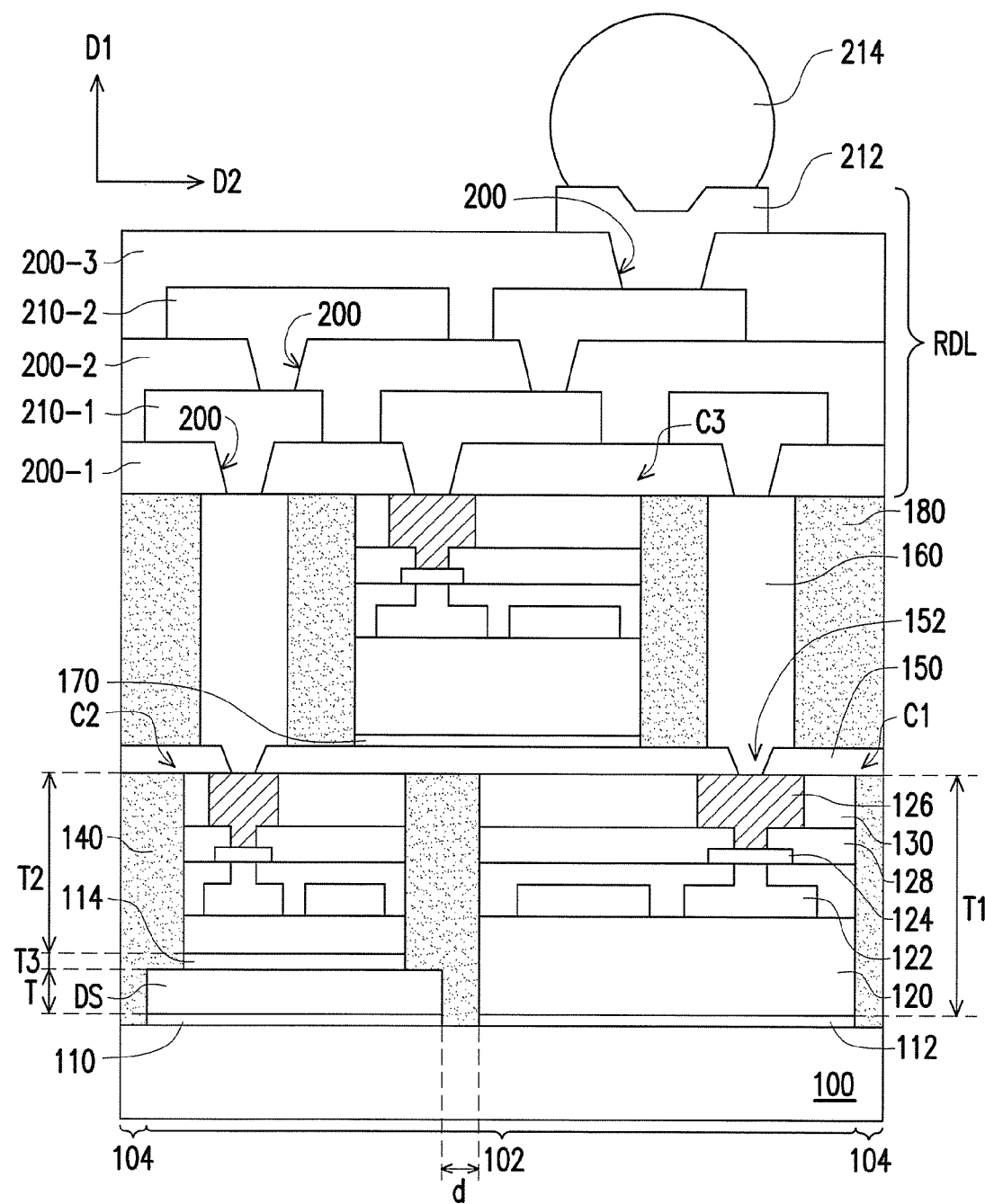

Referring to FIG. 2H, after the redistribution circuit structure RDL is formed, a conductive ball 214 is placed on the under-ball metallurgy pattern 212, and a plurality of passive components (not shown) are mounted on the connection pads. In some embodiments, the conductive ball 214 may be placed on the under-ball metallurgy pattern 212 by ball placement process, and the passive components may be mounted on the connection pads through reflow process.

In some embodiments, the third integrated circuit C3, the encapsulant 180, the redistribution circuit structure RDL and the conductive ball 214 are sequentially formed over the carrier 100. However, the disclosure is not limited thereto. In alternative embodiments, a package structure including the third integrated circuit C3, the encapsulant 180, the redistribution circuit structure RDL and the conductive ball 214 are pre-formed on another carrier, and the package structure is de-bonded from the carrier and electrically connected to a package structure of FIG. 2D.

Figure 2I:
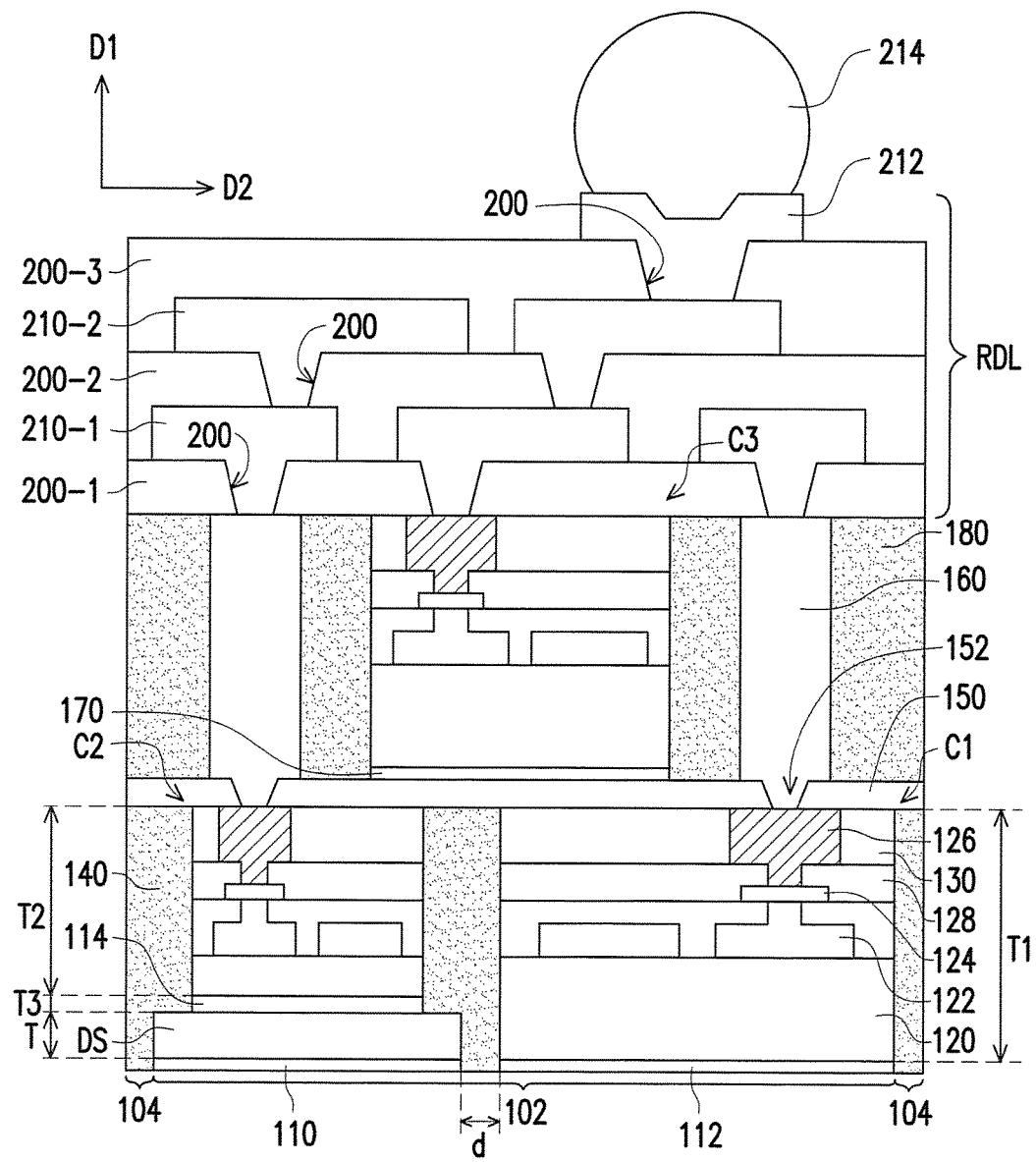

Referring to FIG. 2H and FIG. 2I, after the conductive ball 214 is formed, the carrier 100 is removed. In some embodiments, the formed structure is de-bonded from the glue layers (not shown) such that the formed structure is separated from the carrier 100. In some embodiments, the formed structure is peeled from the carrier 100 and the glue layer 110 and the glue layer 112 are retained underneath the dummy substrate DS and the first integrated circuit C1 respectively. In alternative embodiments, the formed structure de-bonded from the carrier 100 may be electrically connected to another package.

Conventionally, packaging the integrated circuits having different sizes may induce asymmetric wafer warpage and surface defects such as crystal originated pits. In some embodiments, by adding the dummy substrate and arranging the dummy substrate and the first integrated circuit to together form the rotationally symmetrical shape, the size difference between the first and second integrated circuits is compensated. Accordingly, a better wafer warpage is obtained and surface defects such as crystal originated pits are prevented.

Figure 4:
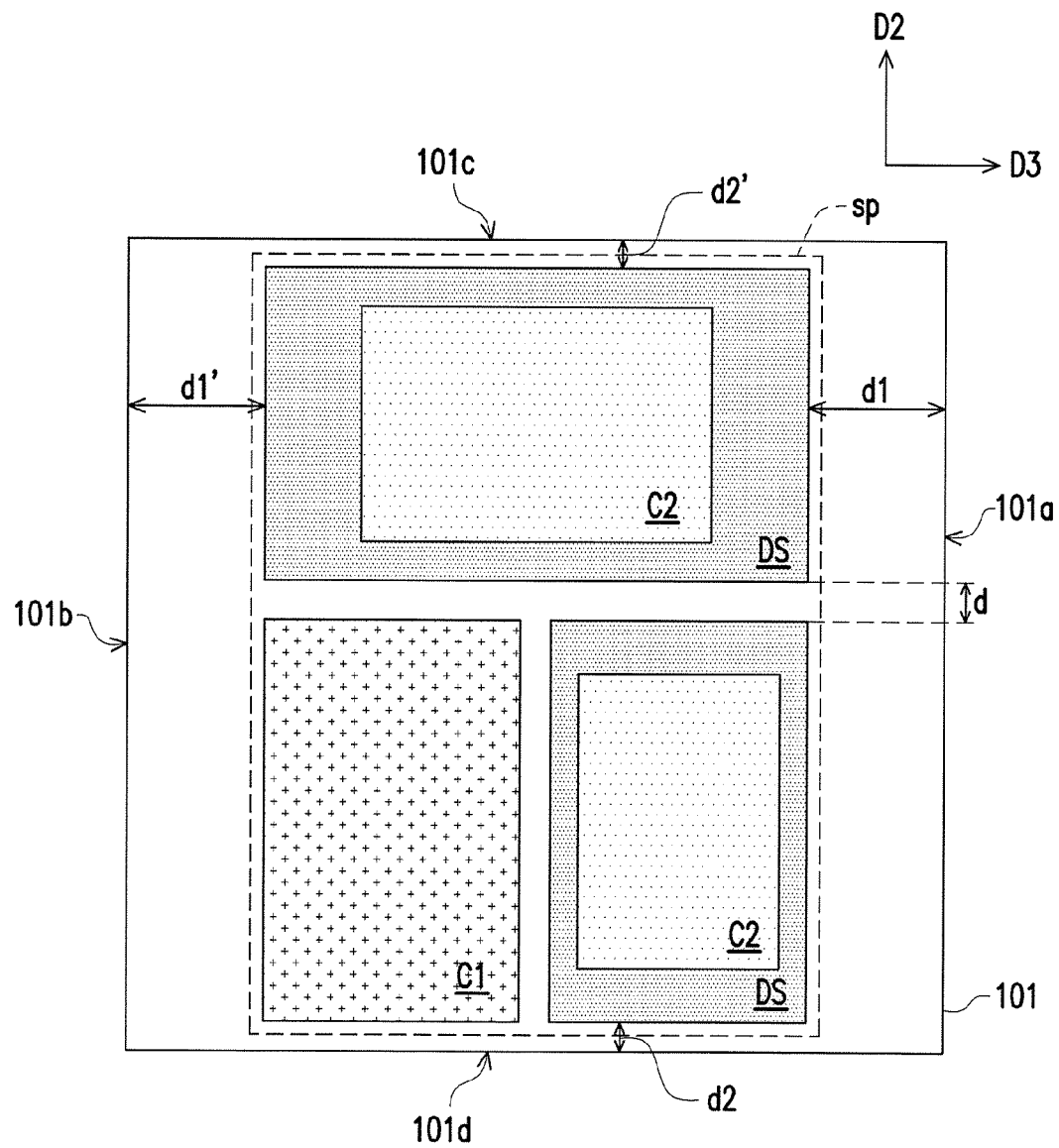
FIG. 4 illustrates a simplified top view of a package structure in accordance with alternative embodiments.

FIG. 4 illustrates a simplified top view of a package structure in accordance with alternative embodiments. Referring to FIG. 4, in some embodiments, a package structure includes a first integrated circuit C1, a plurality of second integrated circuits C2 and a plurality of dummy substrates DS. In some embodiments, the first integrated circuit C1 and the second integrated circuits C2 have different widths from one other, wherein the second integrated circuits C2 are respectively disposed over the dummy substrates DS. In some embodiments, the first integrated circuit C1 and the dummy substrates DS are arranged to together form a rotationally symmetrical shape sp. In some embodiments, the rotationally symmetrical shape sp is a rectangle, for example. In some embodiments, distances d1, d1', d2, d2' between the rotationally symmetrical shape sp and borders 101a, 101b, 101d and 101c of a package region 101 are respectively constant. In some embodiments, the distance d1 is substantially equal to the distance d1', and the distance d2 is substantially equal to the distance d2'. In some embodiments, one first integrated circuit C1 is disposed on the carrier 100. However, the number of the first integrated circuit C1 is not limited in this disclosure. In alternative embodiments, a plurality of the first integrated circuits C1 and at least one dummy substrates DS are arranged to together form a rotationally symmetrical shape. In alternative embodiments, for better wafer and package warpage control, the distances d1, d1', d2, d2' between the borders 101a-101d and the rotationally symmetrical shape sp are the same, that is, d1=d1'=d2=d2'.

In some embodiments, by adding the dummy substrates and arranging the dummy substrates and the first integrated circuit to together form the rotationally symmetrical shape, the size difference between the first and second integrated circuits is compensated. Accordingly, a better wafer warpage is obtained and surface defects such as crystal originated pits are prevented.

Figure 5A:
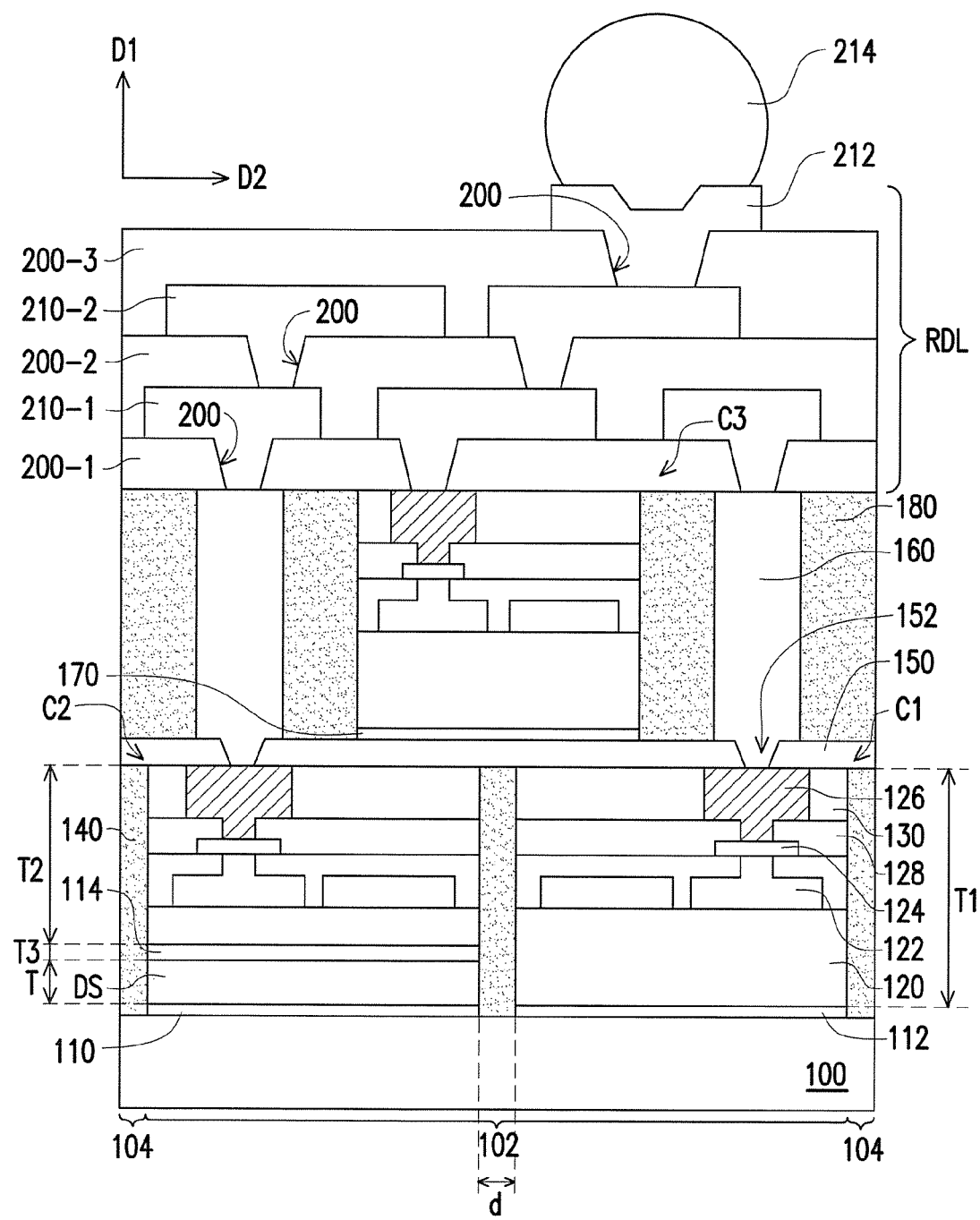
FIG. 5A illustrates a cross-sectional view of a package structure in accordance with alternative embodiments.
Figure 5B:
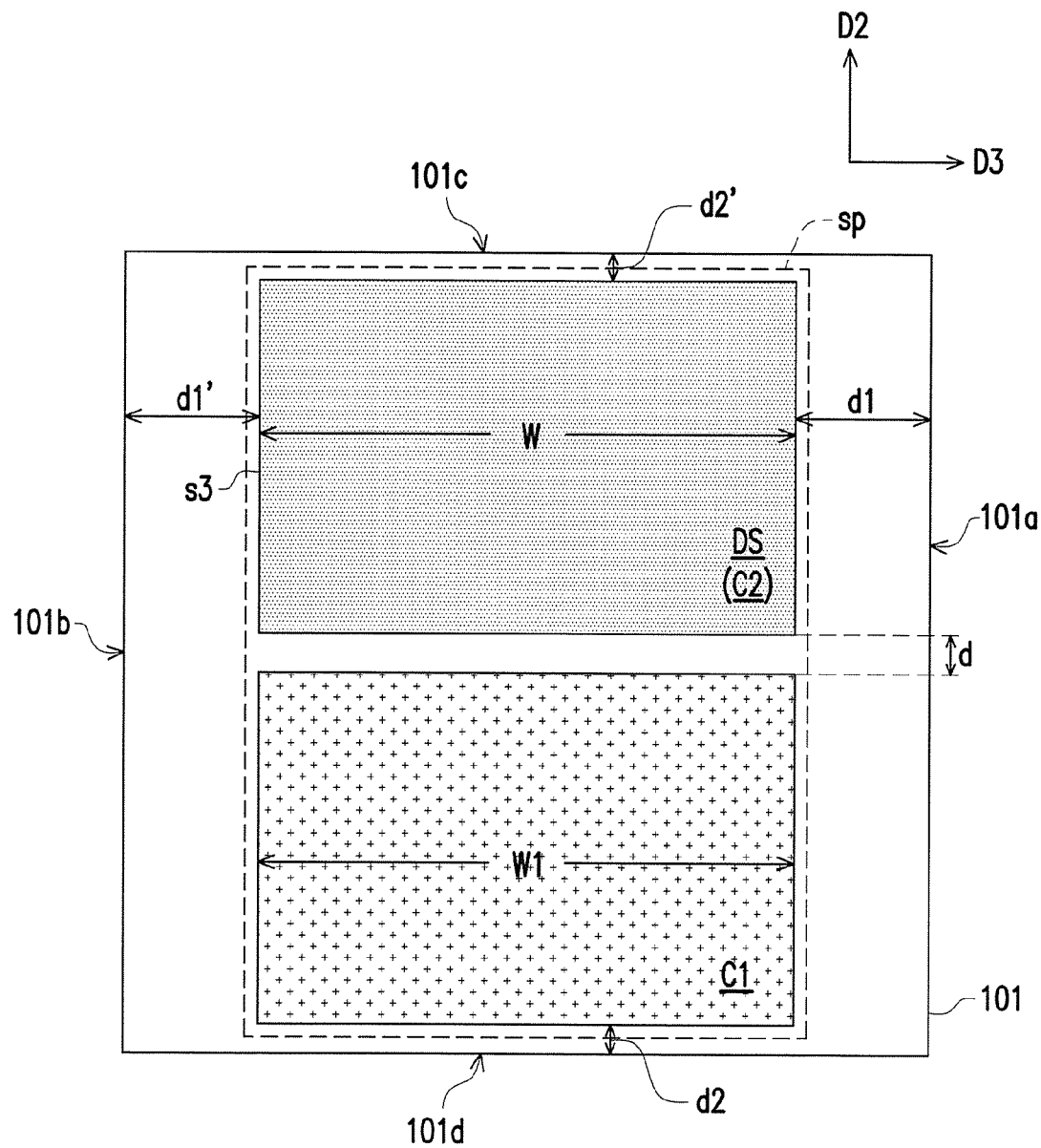
FIG. 5B illustrates a simplified top view of a package structure of FIG. 5A.

The above embodiments illustrate examples where the first integrated circuit C1 on the carrier 100 and the second integrated circuit C2 on the dummy substrate DS have different sizes (e.g., widths). However, it should be noted that the disclosure is not limited thereto. FIG. 5A illustrates a cross-sectional view of a package structure in accordance with alternative embodiments, and FIG. 5B illustrates a simplified top view of a package structure of FIG. 5A. Referring to FIG. 5A and FIG. 5B, in some embodiments, a package structure includes at least one first integrated circuit C1, at least one second integrated circuit C2 and at least one dummy substrate DS disposed in an integrated circuit region 102. In some embodiments, the first integrated circuit C1 and the second integrated circuit C2 have a substantially identical width W, W1 and have different thicknesses T1, T2. In some embodiments, the second integrated circuit C2 having a smaller thickness T2 than the first integrated circuit C1 is disposed on the dummy substrate DS having a thickness T. In some embodiments, the thickness T of the dummy substrate DS is substantially equal to a thickness difference between the first and second integrated circuits C1, C2 subtracting a thickness T3 of the glue layer 114. In some embodiments, the dummy substrate DS and the second integrated circuit C2 have a substantially identical width W. In other words, a total thickness of the thickness T of the dummy substrate DS, the thickness T2 of the second integrated circuit C2 and the thickness T3 of the glue layer 114 is substantially equal to the thickness T1 of the first integrated circuit C1, that is, T1=T2+T+T3. Accordingly, a top surface of the second integrated circuit C2 is substantially coplanar with a top surface of the first integrated circuit C1. In some embodiments, each of the first and second integrated circuits C1, C2 is a package or a chip having a determined thickness and difficult to be processed by reducing thickness process such as grinding. In alternative embodiments, the first and second integrated circuits C1, C2 are dies.

In some embodiments, the dummy substrate DS compensates the thickness difference between the first and second integrated circuits C1, C2, and thus subsequent processes such as placing a third integrated circuit C3 thereon may be performed on a substantially planar surface.

Figure 6:
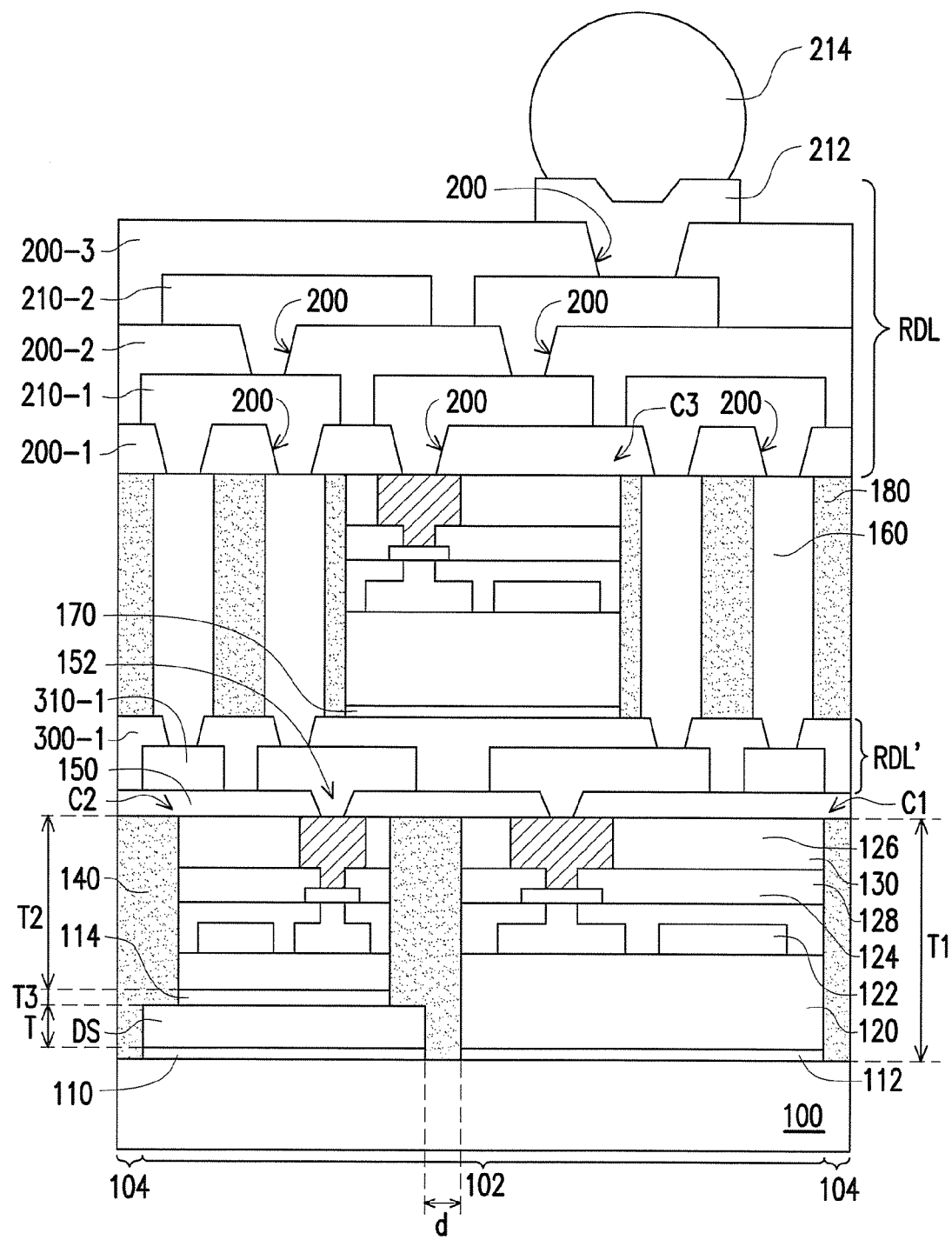
FIG. 6 illustrates a cross-sectional view of a package structure in accordance with alternative embodiments.

The above embodiments illustrate examples where the connector 126 of the first and second integrated circuit C1, C2 is directly connected to the through vias 160. However, it should be noted that the disclosure is not limited thereto. In some embodiments, as shown in FIG. 6, a redistribution circuit structure RDL' is further disposed between the connector 126 of the first and second integrated circuit C1, C2 and the through vias 160. In some embodiments, the redistribution circuit structure RDL' includes a first dielectric layer 300-1 and patterned conductive layers 310-1 disposed therein and thereon. In some embodiments, the method of forming the redistribution circuit structure RDL' is similar to the method of forming the redistribution circuit structure RDL, so the details are not iterated herein.

In view of the above, the present disclosure provides a package structure including at least one first integrated circuit, at least one second integrated circuit and at least one dummy substrate, wherein the second integrated circuit is disposed on the dummy substrate. In some embodiments, the first and second integrated circuits have different sizes, and the dummy substrate and the first integrated circuit are arranged to together form a rotationally symmetrical shape. Therefore, the size difference between the first and second integrated circuits is compensated by the dummy substrate. Accordingly, a better wafer warpage is obtained and surface defects such as crystal originated pits are prevented. In alternative embodiments, the first and second integrated circuits have different thickness, and a total thickness of the dummy substrate and the second integrated circuit is substantially equal to a thickness of the first integrated circuit. Accordingly, top surfaces of the first and second integrated circuits are substantially coplanar with one another since the dummy substrate compensates the thickness difference between the first and second integrated circuits, and subsequent processes may be performed on a substantially planar surface.

In accordance with some embodiments of the present disclosure, a package structure includes at least one first integrated circuit, at least one second integrated circuit, at least one dummy substrate and an encapsulant. The at least one second integrated circuit is disposed on the at least one dummy substrate in a first direction, and the at least one first integrated circuit and the at least one dummy substrate are separated by a distance in a second direction perpendicular to the first direction. The encapsulant is aside the at least one first integrated circuit, the at least one second integrated circuit and the at least one dummy substrate.

In accordance with alternative embodiments of the present disclosure, a package structure includes at least one first integrated circuit, at least one second integrated circuit, at least one dummy substrate and an encapsulant. The at least one second integrated circuit is disposed on the at least one dummy substrate, and a bottom of the at least one first integrated circuit and a bottom of the at least one dummy substrate are arranged to together form a rotationally symmetrical shape. The encapsulant is aside the at least one first integrated circuit, the at least one second integrated circuit and the at least one dummy substrate.

In accordance with yet alternative embodiments of the present disclosure, a method of forming a package structure includes at least the following steps. At least one dummy substrate is placed on a carrier. At least one first integrated circuit is placed on the carrier in a manner such that a bottom of the at least one first integrated circuit and a bottom of the at least one dummy substrate are arranged to together form a rotationally symmetrical shape. At least one second integrated circuit is placed on the at least one dummy substrate. An encapsulant is formed to encapsulate the first integrated circuit, the second integrated circuit and the dummy substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    at least one first die;
    a plurality of second dies;
    a plurality of dummy substrates, wherein the plurality of second dies are respectively disposed over the plurality of dummy substrates in a first direction, the at least one first die and the plurality of dummy substrates are separated by a distance in a second direction perpendicular to the first direction, a bottom surface of one of the plurality of second dies is adhered to a top surface of the corresponding dummy substrate through a glue layer, a total area of the bottom surface of the one of the plurality of second dies is smaller than a total area of the top surface of the corresponding dummy substrate, and a total thickness of the at least one first die is substantially equal to a total thickness of the one of the plurality of second dies, the corresponding dummy substrate and the glue layer; and
    an encapsulant aside the at least one first die, the plurality of second dies and the plurality of dummy substrates.

2. The package structure of claim 1, wherein a coefficient of thermal expansion (CTE) of each of the plurality of dummy substrates is smaller than a CTE of the encapsulant.

3. The package structure of claim 1, wherein at least one of the plurality of second dies comprises a substrate, and a coefficient of thermal expansion (CTE) of each of the plurality of dummy substrates is substantially equal to a CTE of the substrate.

4. The package structure of claim 1, wherein the at least one first die comprises a substrate, and a coefficient of thermal expansion (CTE) of each of the plurality of dummy substrates is substantially equal to a CTE of the substrate.

5. The package structure of claim 1, further comprising at least one third die disposed over the at least one first die and the plurality of second dies in the first direction.

6. A package structure, comprising:
    at least one first die;
    a plurality of second dies;
    a plurality of dummy substrates, wherein the plurality of second dies are respectively disposed over the plurality of dummy substrates, wherein a bottom surface of one of the plurality of second dies is adhered to a top surface of the corresponding dummy substrate through a glue layer, a total area of the bottom surface of the one of the plurality of second dies is smaller than a total area of the top surface of the corresponding dummy substrate, and a total thickness of the at least one first die is substantially equal to a total thickness of the one of the plurality of second dies, the corresponding dummy substrate and the glue layer; and
    an encapsulant aside the at least one first die, the plurality of second dies and the plurality of dummy substrates.

7. The package structure of claim 6, wherein a bottom of the at least one first die and bottoms of the plurality of dummy substrates are arranged to together form a rotationally symmetrical shape.

8. The package structure of claim 7, wherein the package structure is disposed in a package area, and the package area is a shape substantially having rotational symmetry.

9. The package structure of claim 8, wherein a center of the rotationally symmetrical shape is overlapped with a center of the package area.

10. The package structure of claim 9, wherein a distance between a first border of the package area and the rotationally symmetrical shape is substantially equal to a distance between a second border of the package area and the rotationally symmetrical shape, and the first and second borders are opposite to each other.

11. The package structure of claim 6, wherein a width of at least one of the plurality of second dies is different from a width of the corresponding dummy substrate.

12. The package structure of claim 6, wherein the total area of the bottom surface of the one of the plurality of second dies is defined by a product of a first width and a first length of the one of the plurality of second dies, the first width and the first length are different from a second width and a second length, respectively, of the corresponding dummy substrate.

13. The package structure of claim 6, wherein a topmost surface of the at least one first die and topmost surfaces of the plurality of second dies are substantially coplanar.

14. The package structure of claim 6, further comprising at least one third die disposed over the at least one first die and the plurality of second dies.

15. The package structure of claim 6, wherein each of the plurality of dummy substrates comprises no active elements.

16. The package structure of claim 6, wherein the package structure is disposed in a package area, and an entire distance between a first edge of the package area and a sidewall of one of the plurality of dummy substrate is substantially the same as an entire distance between the first edge of the package area and a sidewall of the first die when viewing from the plan view.

17. The package structure of claim 16, wherein an entire distance between a second edge opposite to the first edge of the package area and a sidewall of another one of the plurality of dummy substrate is substantially the same as the entire distance between the first edge of the package area and the sidewall of the first die when viewing from the plan view.

18. The package structure of claim 6, wherein a first surface of the glue layer is flush against the entire bottom surface of the one of the plurality of second dies, and a second surface opposite to the first surface of the glue layer is flush against the top surface of the corresponding dummy substrate.

19. A method of forming a package structure, comprising:
placing a plurality of dummy substrates on a carrier;
placing at least one first die on the carrier;
placing a plurality of second dies on the plurality of dummy substrates respectively, wherein a bottom surface of one of the plurality of second dies is adhered to a top surface of the corresponding dummy substrate through a glue layer, a total area of the bottom surface of the one of the plurality of second dies is smaller than a total area of the top surface of the corresponding dummy substrate, and a total thickness of the at least one first die is substantially equal to a total thickness of the one of the plurality of second dies, the corresponding dummy substrate and the glue layer;
forming an encapsulant to encapsulate the at least one first die, the plurality of second dies and the plurality of dummy substrates; and
removing the carrier.

20. The method of claim 19, further comprising forming a third die over the at least one first die and the plurality of second dies.

* * * * *